(12) United States Patent
Kitagawa et al.

(10) Patent No.: US 12,309,982 B2
(45) Date of Patent: May 20, 2025

(54) POWER CONVERSION DEVICE

(71) Applicant: Mitsubishi Electric Corporation, Tokyo (JP)

(72) Inventors: Shingo Kitagawa, Tokyo (JP); Daisuke Sasaki, Tokyo (JP); Kohei Ando, Tokyo (JP); Yoshifumi Mizuno, Tokyo (JP); Yoshitsugu Hirayama, Tokyo (JP); Hirofumi Inoue, Tokyo (JP); Koji Uyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 248 days.

(21) Appl. No.: 17/967,586

(22) Filed: Oct. 17, 2022

(65) Prior Publication Data

US 2023/0156980 A1 May 18, 2023

(30) Foreign Application Priority Data

Nov. 15, 2021 (JP) .................. 2021-185468

(51) Int. Cl.
*H05K 7/20* (2006.01)
*H02M 7/00* (2006.01)

(52) U.S. Cl.
CPC ........ *H05K 7/20927* (2013.01); *H02M 7/003* (2013.01); *H05K 7/20254* (2013.01)

(58) Field of Classification Search
CPC .......... H05K 7/20927; H05K 7/20254; H05K 7/023; H05K 7/02; H05K 7/20272; H05K 7/209; H02M 7/003; H02M 1/327; H02M 1/00; H01L 23/473; H01G 2/08
See application file for complete search history.

(56) References Cited

U.S. PATENT DOCUMENTS

| | | | |
|---|---|---|---|
| 2010/0157640 A1 | 6/2010 | Azuma et al. | |
| 2012/0008286 A1* | 1/2012 | Suzuki | B60L 15/007 |
| | | | 361/728 |
| 2013/0308257 A1* | 11/2013 | Kosugi | H05K 7/1417 |
| | | | 361/679.01 |
| 2014/0140117 A1* | 5/2014 | Ishibashi | H05K 7/20927 |
| | | | 363/141 |
| 2014/0246768 A1* | 9/2014 | Soyano | H01L 23/564 |
| | | | 257/691 |

(Continued)

FOREIGN PATENT DOCUMENTS

| | | |
|---|---|---|
| JP | 2004-282804 A | 10/2004 |
| JP | 2013-176297 A | 9/2013 |
| JP | 2014-103303 A | 6/2014 |

(Continued)

OTHER PUBLICATIONS

Office Action dated Aug. 30, 2022 issued by the Japanese Patent Office in Japanese Application No. 2021-185468.

*Primary Examiner* — Adam B Dravininkas
(74) *Attorney, Agent, or Firm* — Sughrue Mion, PLLC

(57) ABSTRACT

In a power conversion device, a semiconductor module, a bus bar assembly, and a smoothing capacitor are superposed on a cooler in the stated order from the cooler side. At least one of a cooling column-equipped member, which is at least one of the smoothing capacitor and the bus bar assembly, and the cooler is provided with a cooling column configured to transfer heat of the cooling column-equipped member to the cooler.

7 Claims, 13 Drawing Sheets

(56) References Cited

U.S. PATENT DOCUMENTS

2020/0259290 A1* 8/2020 Hashii .................... H01R 12/58
2021/0112689 A1* 4/2021 Hashii ................... H01L 25/072

FOREIGN PATENT DOCUMENTS

| JP | 5521091 B2 | 6/2014 |
| JP | 5694278 B2 | 4/2015 |
| WO | 2013/111261 A1 | 8/2013 |
| WO | 2018/193588 A1 | 10/2018 |

* cited by examiner

POWER CONVERSION DEVICE

BACKGROUND OF THE INVENTION

1. Field of the Invention

This disclosure relates to a power conversion device.

2. Description of the Related Art

In a related-art power conversion device, a water passage defining member has a flow passage for cooling water. A power module is arranged on a first surface of the water passage defining member. Further, a capacitor module is arranged on a second surface of the water passage defining member. The second surface is a surface on a side opposite to the first surface across the flow passage (see, for example, Japanese Patent Application Laid-open No. 2013-176297).

In the above-mentioned related-art power conversion device, the power module is arranged on the first surface, and the capacitor module is arranged on the second surface. Thus, at the time of assembly of the power conversion device, the water passage defining member is required to be inverted. Thus, ease of assembly is poor.

SUMMARY OF THE INVENTION

This disclosure has been made to solve the above-mentioned problem, and has an object to provide a power conversion device which is improved in ease of assembly while preventing reduction in cooling performance.

According to at least one embodiment of this disclosure, there is provided a power conversion device, including: a semiconductor module; a smoothing capacitor configured to smooth an input voltage to the semiconductor module; a bus bar assembly configured to electrically connect at least two of the semiconductor module, the smoothing capacitor, and a power supply; and a cooler, wherein the semiconductor module, the bus bar assembly, and the smoothing capacitor are superposed on the cooler in the stated order from the cooler side, and wherein at least one of a cooling column-equipped member, which is at least one of the smoothing capacitor and the bus bar assembly, and the cooler is provided with a cooling column configured to transfer heat of the cooling column-equipped member to the cooler.

According to the power conversion device of this disclosure, ease of assembly can be improved while preventing reduction in cooling performance.

DESCRIPTION OF THE EMBODIMENTS

Now, embodiments of this disclosure are described with reference to the drawings.

First Embodiment

Figure 1:
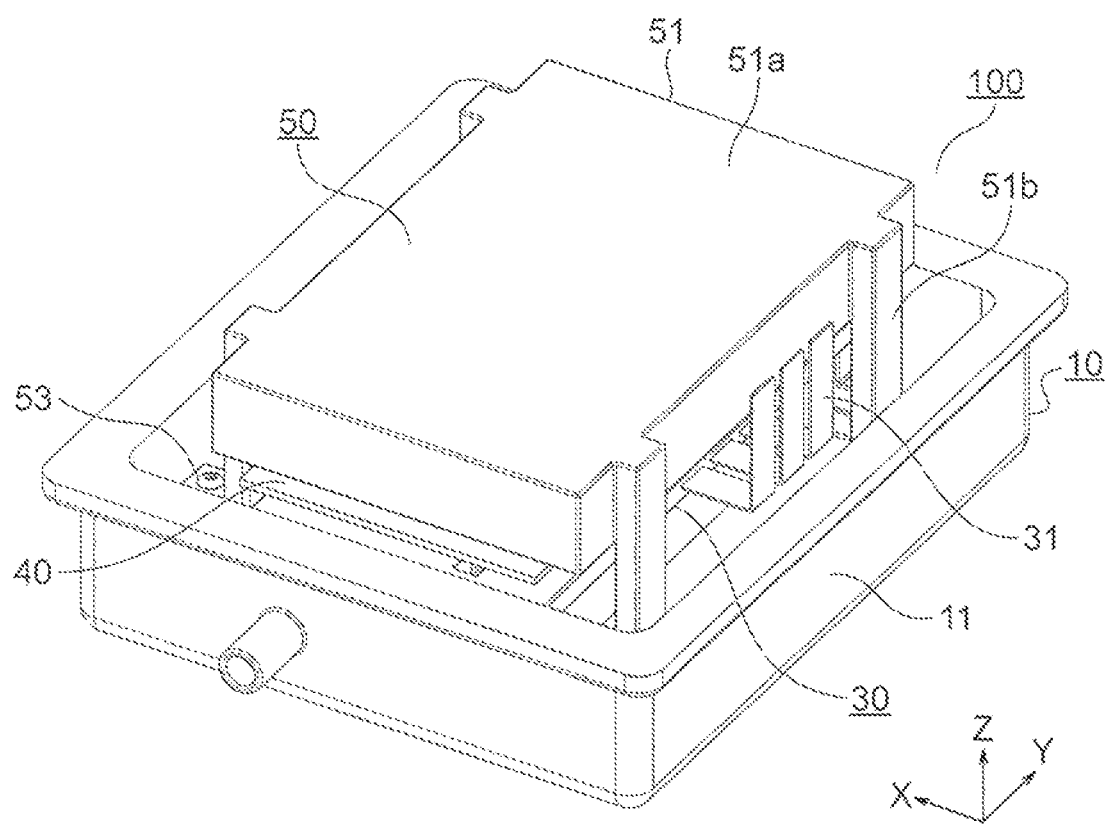
FIG. 1 is a perspective view for illustrating a power conversion device according to a first embodiment.
Figure 2:
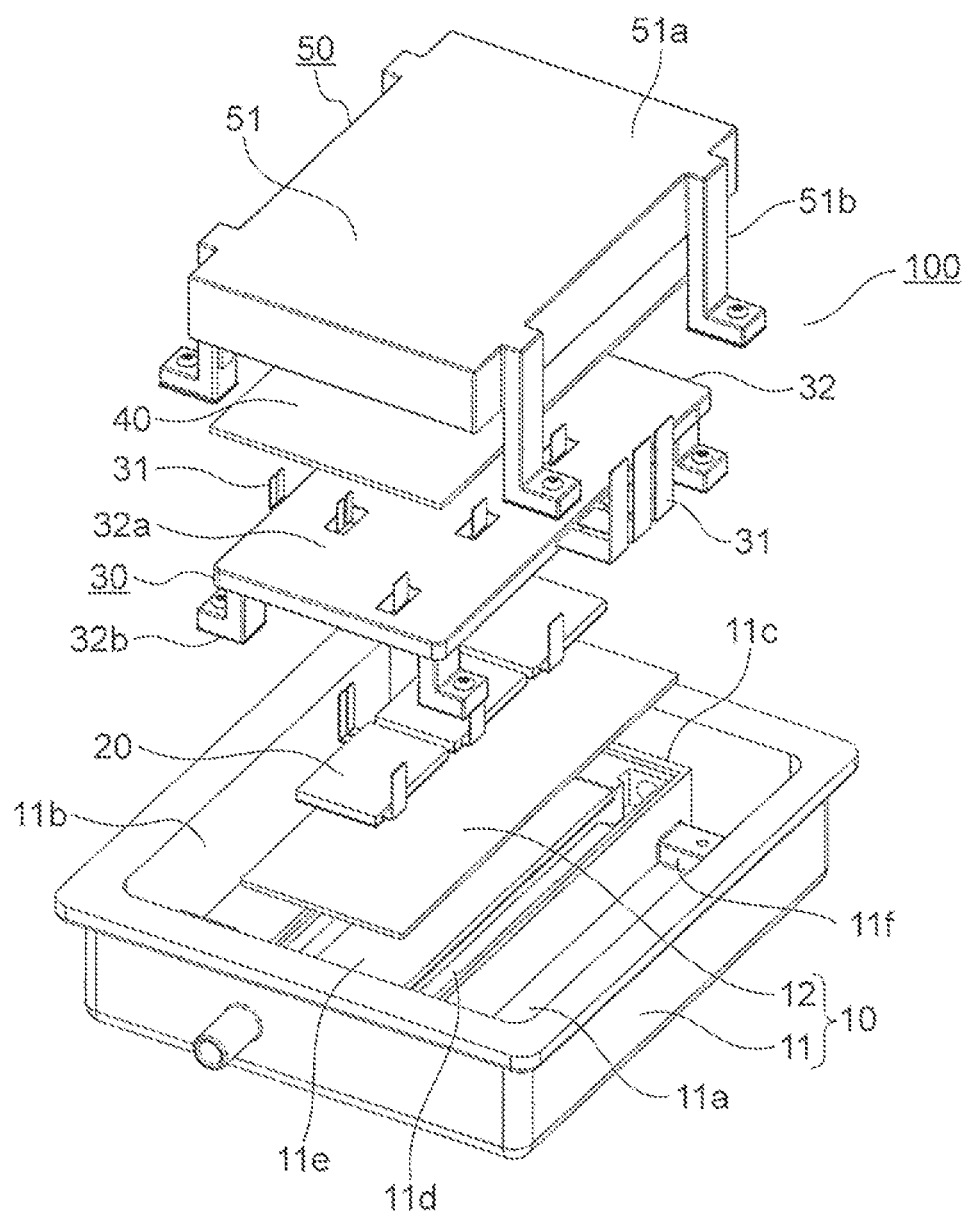
FIG. 2 is an exploded perspective view for illustrating the power conversion device of FIG. 1.

FIG. 1 is a perspective view for illustrating a power conversion device according to a first embodiment. FIG. 2 is an exploded perspective view for illustrating the power conversion device of FIG. 1. A power conversion device 100 according to the first embodiment supplies AC power to a driving motor for a hybrid automobile or an electric automobile. However, uses of the power conversion device 100 are not particularly limited.

Further, the power conversion device 100 according to the first embodiment functions as an inverter that converts DC power from a battery into AC power so as to drive a rotating electric machine including the driving motor. Further, the power conversion device 100 according to the first embodiment functions as a converter that converts AC power output from a generator into DC power so as to charge the battery.

As illustrated in FIG. 1 and FIG. 2, the power conversion device 100 includes a cooler 10, a plurality of semiconductor modules 20, a bus bar assembly 30, a control board 40, and a smoothing capacitor 50.

The plurality of semiconductor modules 20, the bus bar assembly 30, the control board 40, and the smoothing capacitor 50 are arranged on the cooler 10. Further, the plurality of semiconductor modules 20, the bus bar assembly 30, the control board 40, and the smoothing capacitor 50 are superposed in the stated order from the cooler 10 side.

The cooler 10 is made of, for example, aluminum or an aluminum alloy. Further, the cooler 10 includes a cooler main body 11 and a cooler upper plate 12. The cooler upper plate 12 is a rectangular flat plate.

The control board 40 includes a drive circuit (not shown) and a control circuit (not shown). The drive circuit drives the plurality of semiconductor modules 20. The control circuit controls the drive circuit.

One control board 40 is illustrated in FIG. 2. However, the control board 40 may be divided into a plurality of boards in view of, for example, functionality, ease of layout, and productivity. Further, the control board 40 may be arranged at a position different from that illustrated in FIG. 2. For example, the control board 40 may be arranged on a side opposite to the bus bar assembly 30 with respect to the smoothing capacitor 50.

Figure 3:
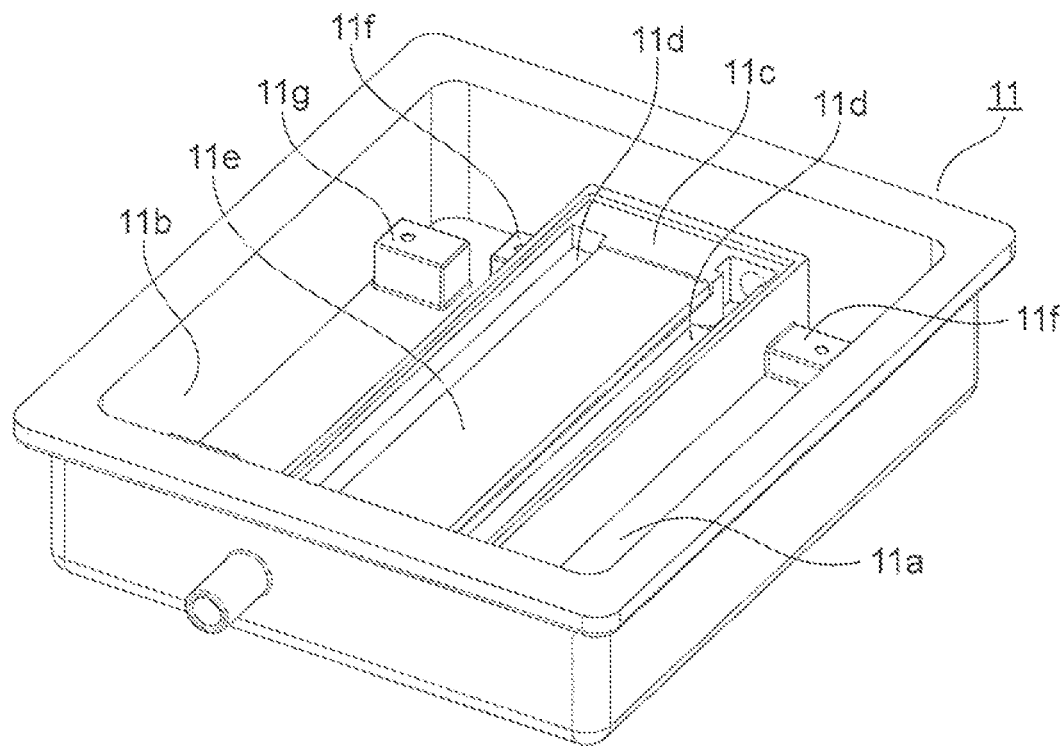
FIG. 3 is a perspective view for illustrating a cooler main body of FIG. 2.

FIG. 3 is a perspective view for illustrating the cooler main body 11 of FIG. 2. The cooler main body 11 includes a bottom portion 11a, a side wall portion 11b, a flow passage defining portion 11c, a heat transfer fin 11e, a plurality of first receiving portions 11f, and a plurality of second receiving portions 11g. Each of the first receiving portions 11f and the second receiving portions 11g has a block-like shape.

The bottom portion 11a has a rectangular flat plate-like shape. The side wall portion 11b has a rectangular frame-like shape. Further, the side wall portion 11b protrudes from a peripheral edge of the bottom portion 11a at a right angle with respect to the bottom portion 11a.

The flow passage defining portion 11c is located on an inner side of the side wall portion 11b, and protrudes from the bottom portion 11a in the same direction as the direction in which the side wall portion 11b protrudes. The flow passage defining portion 11c has refrigerant flow passages lid each having a groove-like shape.

The refrigerant flow passages lid allow a refrigerant (not shown) to flow therethrough. In the first embodiment, water is used as the refrigerant. Specifically, the cooler 10 according to the first embodiment is a water-cooling cooler. The heat transfer fin 11e faces the refrigerant flow passages 11d.

The plurality of first receiving portions 11f and the plurality of second receiving portions 11g protrude from the bottom portion 11a in the same direction as the direction in which the flow passage defining portion 11c protrudes. Further, the plurality of first receiving portions 11f and the plurality of second receiving portions 11g are arranged between the side wall portion 11b and the flow passage defining portion 11c.

The first receiving portions 11f are adjacent to the flow passage defining portion 11c. The plurality of second receiving portion 11g are arranged farther from the flow passage defining portion 11c than the plurality of first receiving portions 11f are. Further, a protrusion amount of each of the second receiving portions 11g from the bottom portion 11a is larger than a protrusion amount of each of the first receiving portions 11f from the bottom portion 11a.

Figure 4:
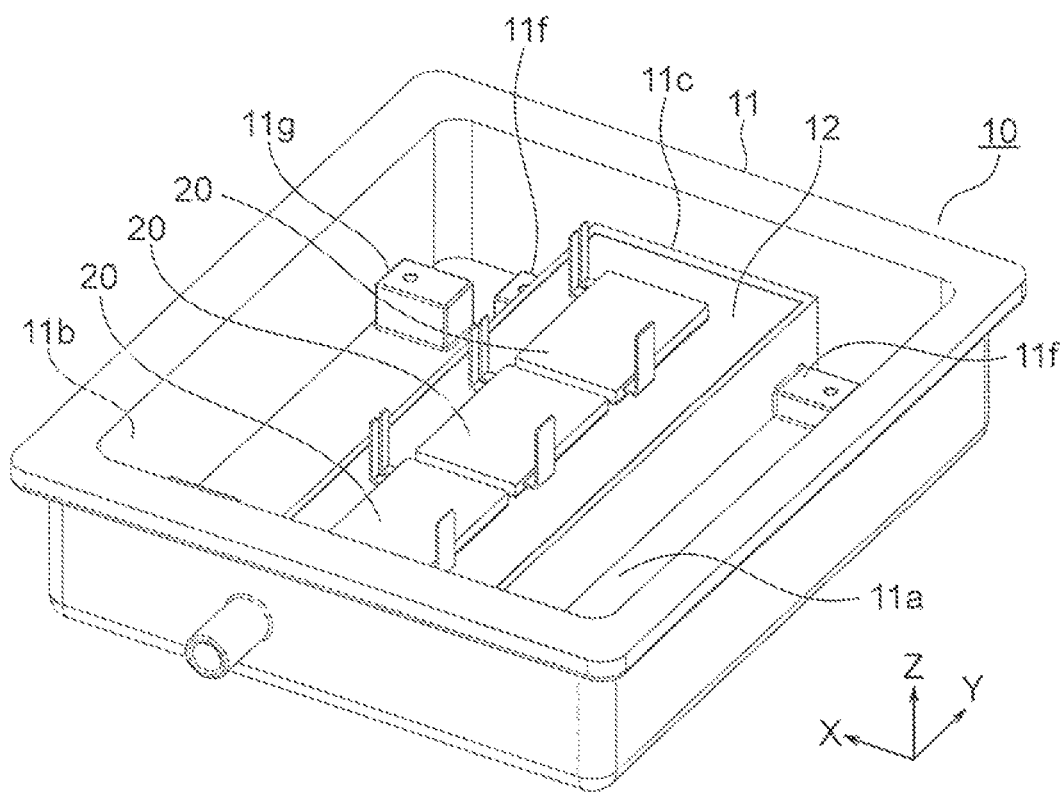
FIG. 4 is a perspective view for illustrating a state in which a plurality of semiconductor modules of FIG. 2 are mounted on the cooler.

FIG. 4 is a perspective view for illustrating a state in which the plurality of semiconductor modules 20 of FIG. 2 are mounted on the cooler 10. The cooler upper plate 12 is joined to the flow passage defining portion 11c through intermediation of a sealing component (not shown). For example, a gasket is used as the sealing component. The cooler upper plate 12 may also be joined to the flow passage defining portion 11c by friction stir welding (FSW) or electron beam welding.

When the cooler upper plate 12 is mounted onto the flow passage defining portion 11c, the refrigerant flow passages 11d are defined inside the cooler 10.

The plurality of semiconductor modules 20 are mounted on the cooler upper plate 12. Each of the semiconductor modules 20 includes a power semiconductor element (not shown). The power semiconductor element is, for example, an insulated gate bipolar transistor (IGBT).

Each of the semiconductor modules 20 generates heat as a result of its high-speed switching operation. The heat generated in each of the semiconductor modules 20 is transferred to the refrigerant flowing through the refrigerant flow passages 11d via the cooler upper plate 12.

Figure 5:
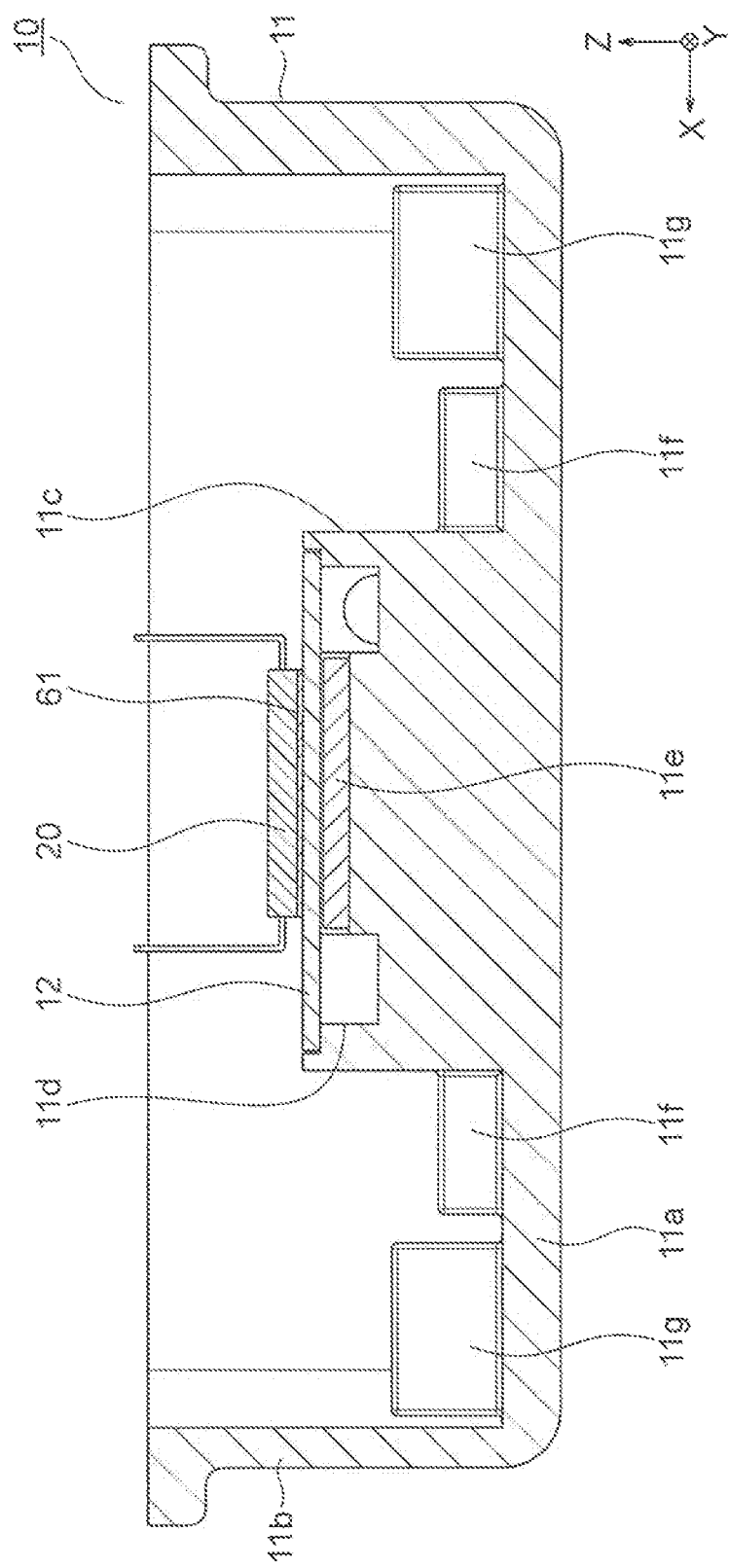
FIG. 5 is a sectional view of an assembly including the cooler and the plurality of semiconductor modules of FIG. 4.

FIG. 5 is a sectional view of an assembly including the cooler 10 and the plurality of semiconductor modules 20 of FIG. 4, and is an illustration of a cross section taken parallel to an XZ plane of FIG. 4. A first heat transfer member 61 serving as a module heat transfer member is provided between each of the semiconductor modules 20 and the cooler upper plate 12. As a material of the first heat transfer members 61, a material having high heat conductivity, for example, grease, solder, adhesive, gap filler, or a compound is used.

Figure 6:
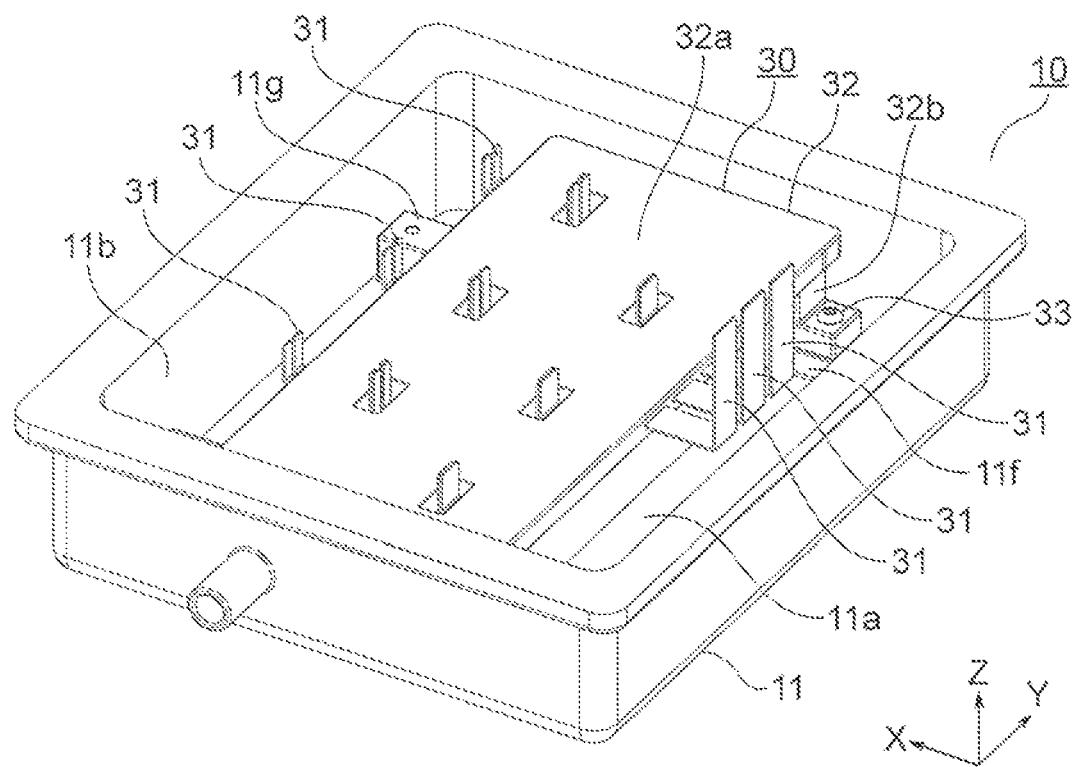
FIG. 6 is a perspective view for illustrating a state in which a bus bar assembly of FIG. 2 is mounted on the plurality of semiconductor modules of FIG. 4.
Figure 7:
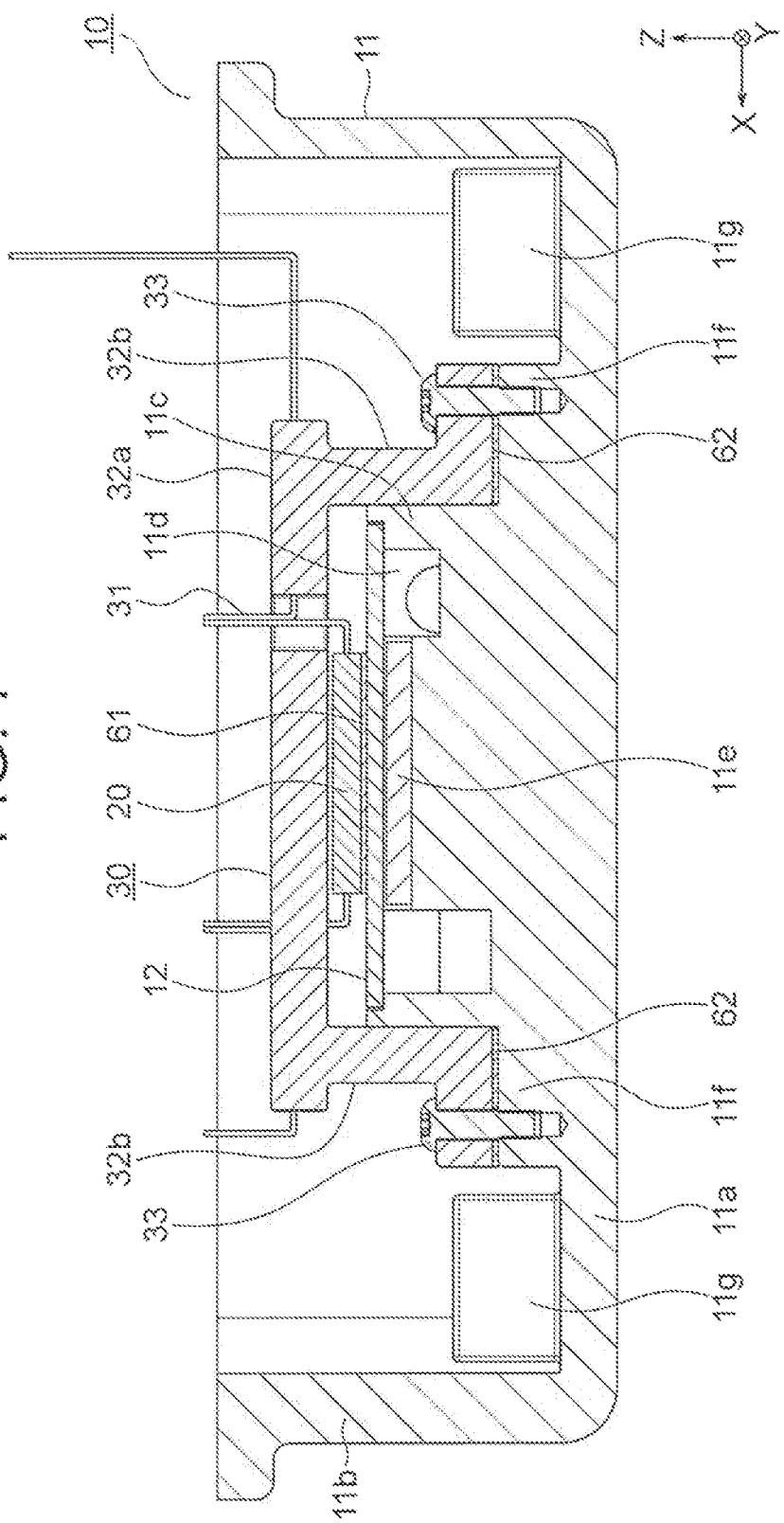
FIG. 7 is a sectional view of an assembly including the cooler, the plurality of semiconductor modules, and the bus bar assembly of FIG. 6.

FIG. 6 is a perspective view for illustrating a state in which the bus bar assembly 30 of FIG. 2 is mounted on the plurality of semiconductor modules 20 of FIG. 4. FIG. 7 is a sectional view of an assembly including the cooler 10, the plurality of semiconductor modules 20, and the bus bar assembly 30 of FIG. 6, and is an illustration of a cross section taken parallel to an XZ plane of FIG. 6.

The bus bar assembly 30 includes a plurality of sheet metal members 31 and a holding member 32. The holding member 32 is made of a resin. The plurality of sheet metal members 31 and the holding member 32 are formed integrally by insert molding. With this configuration, the plurality of sheet metal members 31 are held in the holding member 32.

The plurality of sheet metal members 31 electrically connect a DC power supply (not shown), the plurality of semiconductor modules 20, the smoothing capacitor 50, and an external device (not shown). The external device includes a rotating electric machine and an air conditioner.

The holding member 32 includes a holding member main body 32a having a flat plate-like shape and a plurality of first bus bar cooling columns 32b each having a bar-like shape. The holding member main body 32a is opposed to surfaces of the plurality of semiconductor modules 20, which are on a side opposite to the cooler upper plate 12.

The plurality of first bus bar cooling columns 32b protrude from the holding member main body 32a toward the bottom portion 11a. Further, the plurality of first bus bar cooling columns 32b transfer heat of the bus bar assembly 30 to the cooler 10. Specifically, the bus bar assembly 30 is a cooling column-equipped member including the plurality of first bus bar cooling columns 32b serving as heat transfer paths to the cooler 10.

Each of the first bus bar cooling columns 32b is fastened to a corresponding one of the first receiving portions 11f with a first fastener 33. A screw is used as each of the first fasteners 33.

The bus bar cooling columns 32b are in contact with side surfaces of the flow path defining portion 11c. The plurality of first bus bar cooling columns 32b may be made of a material different from a material of the holding member main body 32a, for example, a metal.

A second heat transfer member 62 serving as a cooling column heat transfer member is provided between each of the first bus bar cooling columns 32b and a corresponding one of the first receiving portions 11f. As a material of the second heat transfer members 62, a material having high heat conductivity, for example, grease, solder, adhesive, gap filler, or a compound is used.

The heat received by the bus bar assembly 30 from the plurality of semiconductor modules 20 is transferred through the plurality of first bus bar cooling columns 32b to the plurality of first receiving portions 11f and the flow passage defining portion 11c, and is released through the cooler 10.

Figure 8:
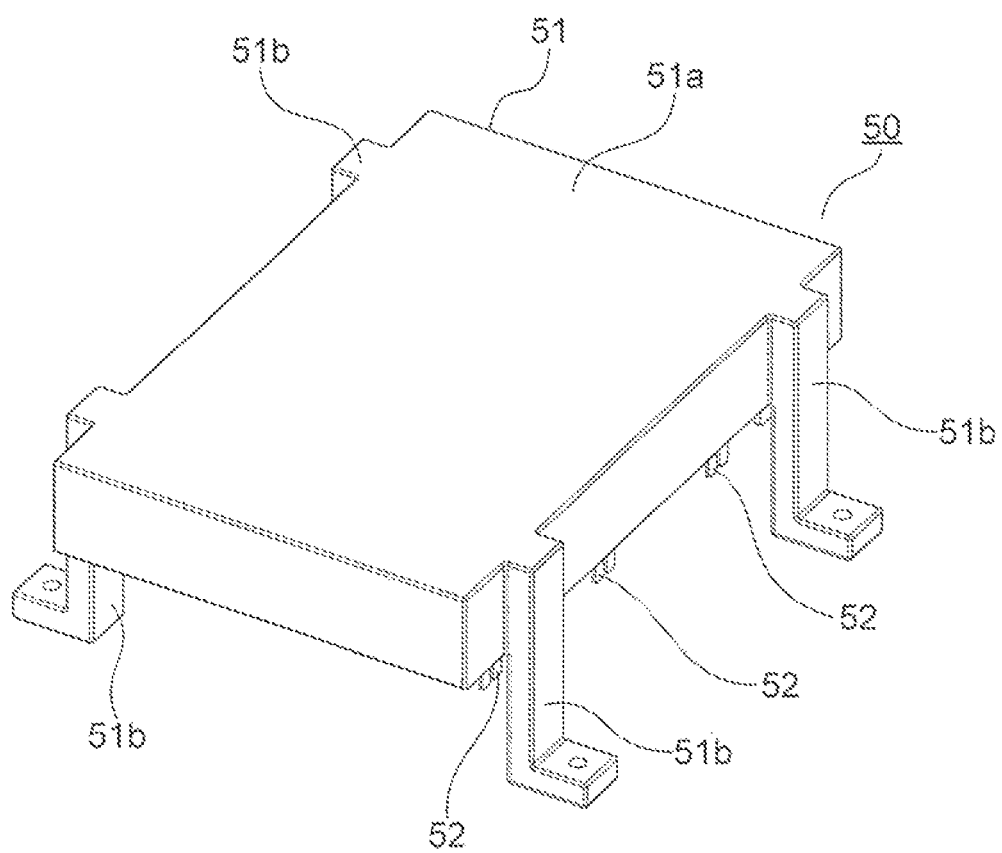
FIG. 8 is a perspective view for illustrating a smoothing capacitor of FIG. 2.
Figure 9:
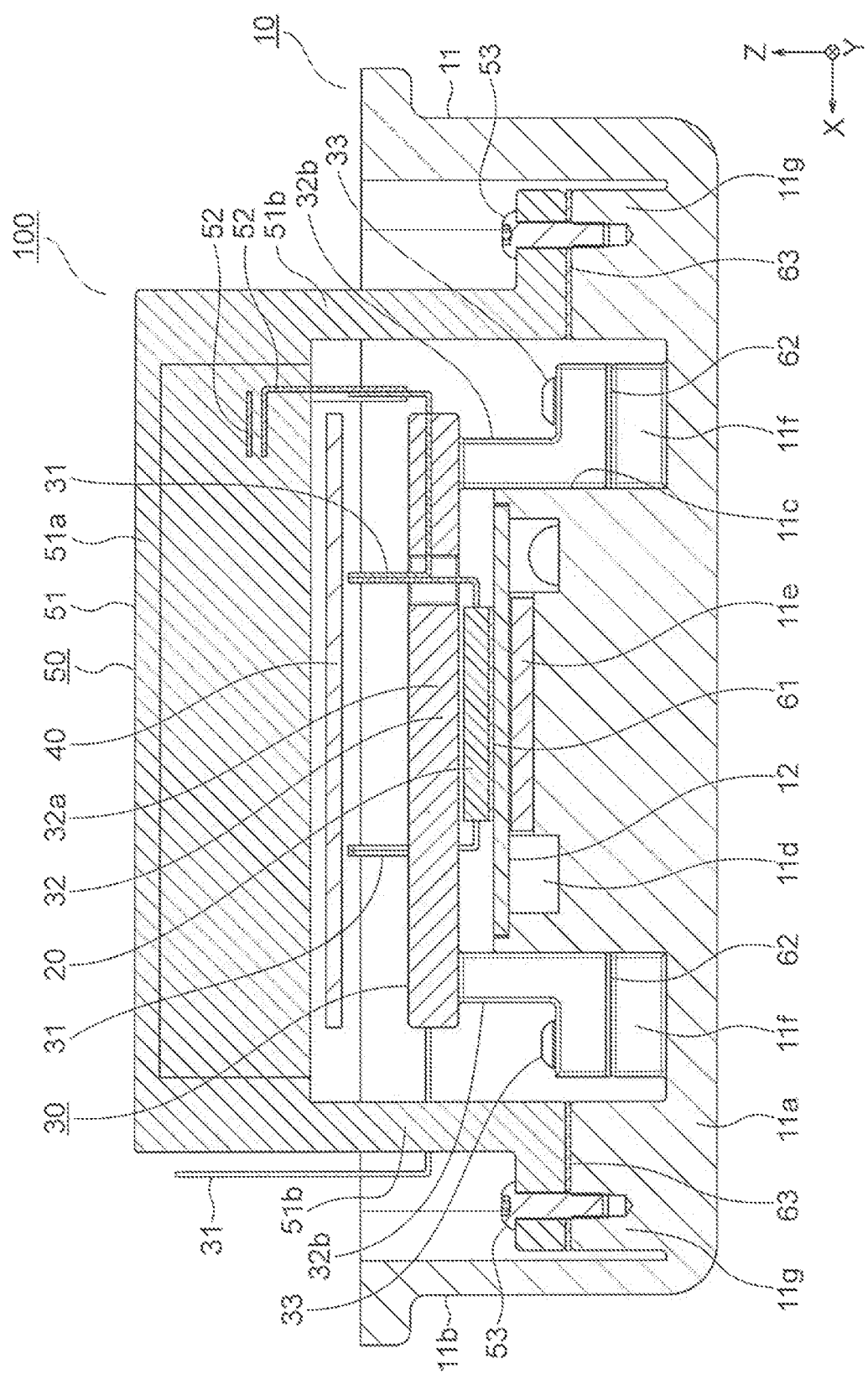
FIG. 9 is a sectional view of the power conversion device of FIG. 1.

FIG. 8 is a perspective view for illustrating the smoothing capacitor 50 of FIG. 2. FIG. 9 is a sectional view of the power conversion device 100 of FIG. 1, and is an illustration of a cross section taken parallel to an XZ plane of FIG. 1.

The smoothing capacitor 50 smooths an input voltage to the plurality of semiconductor modules 20. Further, the smoothing capacitor 50 includes a case 51, a capacitor element (not shown), and a plurality of capacitor bus bars 52. The case 51 is made of a synthetic resin.

The capacitor element is provided in the case 51. A rolled film capacitor is used as the capacitor element. The rolled film capacitor has a flat shape with an elliptical cross section. An epoxy resin is supplied to the case 51 to thereby seal the capacitor element within the case 51.

The plurality of capacitor bus bars 52 are connected to the capacitor element. Further, each of the capacitor bus bars 52 protrudes to an outside of the case 51, and is connected to a corresponding one of the sheet metal members 31.

The case 51 includes a case main body 51a and a plurality of first capacitor cooling columns 51b. The case main body 51a has a flat plate-like shape. Each of the plurality of first capacitor cooling columns 51b has a bar-like shape. The case main body 51a is opposed to a surface of the control board 40 on a side opposite to the bus bar assembly 30.

The plurality of first capacitor cooling columns 51b protrude from the case main body 51a toward the bottom portion 11a. Further, the plurality of first capacitor cooling columns 51b transfer heat of the smoothing capacitor 50 to the cooler 10. Specifically, the smoothing capacitor 50 is a cooling column-equipped member including the plurality of first capacitor cooling columns 51b serving as heat transfer paths to the cooler 10.

As described above, in the first embodiment, both of the bus bar assembly 30 and the smoothing capacitor 50 are the cooling column-equipped members.

Each of the first capacitor cooling columns 51b is fastened to a corresponding one of the second receiving portions 11g with a second fastener 53. A screw is used as each of the second fasteners 53.

The plurality of first capacitor cooling columns 51b may be made of a material different from that of the case main body 51a, for example, a metal.

A third heat transfer member 63 serving as a cooling column heat transfer member is provided between each of the first capacitor cooling columns 51b and a corresponding one of the second receiving portions 11g. As a material of the third heat transfer members 63, a material having high heat conductivity, for example, grease, solder, adhesive, gap filler, or a compound is used.

Heat generated in the smoothing capacitor 50 is transferred from the plurality of first capacitor cooling columns 51b to the plurality of second receiving portions 11g, and is released through the cooler 10.

In the power conversion device 100 as described above, the plurality of semiconductor modules 20, the bus bar assembly 30, and the smoothing capacitor 50 are superposed on the cooler 10 in the stated order. More specifically, the plurality of semiconductor modules 20, the smoothing capacitor 50, and the bus bar assembly 30 are stacked on the same side with respect to the cooler 10.

Thus, the plurality of semiconductor modules 20, the bus bar assembly 30, and the smoothing capacitor 50 can be mounted on the cooler 10 without inverting the cooler 10.

Further, the smoothing capacitor 50 includes the plurality of first capacitor cooling columns 51b. Thus, the first capacitor cooling columns 51b allow the heat generated in the smoothing capacitor 50 to be smoothly transferred to the cooler 10 so that the heat is released through the cooler 10.

Further, the bus bar assembly 30 includes the plurality of first bus bar cooling columns 32b. Thus, the first bus bar cooling columns 32b allow the heat received by the bus bar assembly 30 to be smoothly transferred to the cooler 10 so that the heat is released through the cooler 10.

Thus, the power conversion device 100 according to the first embodiment is improved in ease of assembly while preventing reduction in cooling performance.

Further, the first heat transfer member 61 is provided at a thermal interface being a plane at which each of the semiconductor modules 20 and the cooler 10 are joined together. As a result, an air layer, which is otherwise formed at the thermal interface, is replaced by the first heat transfer member 61. Thus, the heat generated in each of the semiconductor modules 20 can be more smoothly transferred to the cooler 10. As a result, the cooling performance is improved.

Further, the second heat transfer member 62 is provided at a thermal interface being a plane at which each of the first bus bar cooling columns 32b and the cooler 10 are joined together. As a result, an air layer, which is otherwise formed at the thermal interface, is replaced by the second heat transfer member 62. Thus, the heat received by the bus bar assembly 30 can be more smoothly transferred to the cooler 10. As a result, the cooling performance is improved.

Further, the third heat transfer member 63 is provided at a thermal interface being a plane at which each of the first capacitor cooling columns 51b and the cooler 10 are joined together. As a result, an air layer, which is otherwise formed at the thermal interface, is replaced by the third heat transfer member 63. Thus, the heat generated in the smoothing capacitor 50 can be more smoothly transferred to the cooler 10. As a result, the cooling performance is improved.

Further, the plurality of second receiving portions 11g are arranged farther from the flow passage defining portion 11c than the plurality of first receiving portions 11f are. Each of the first bus bar cooling columns 32b is connected to a corresponding one of the first receiving portions 11f, and each of the first capacitor cooling columns 51b is connected to a corresponding one of the second receiving portions 11g. Thus, the power conversion device 100 is improved in ease of assembly.

Further, the plurality of first receiving portions 11f and the plurality of second receiving portions 11g protrude from the bottom portion 11a. Thus, this configuration facilitates the connection of the first bus bar cooling columns 32b and the first capacitor cooling columns 51b to the cooler 10.

The first bus bar cooling columns 32b may be connected to the bottom portion 11a or the side wall portion 11b.

The first capacitor cooling columns 51b may be connected to the bottom portion 11a or the side wall portion 11b.

Figure 10:
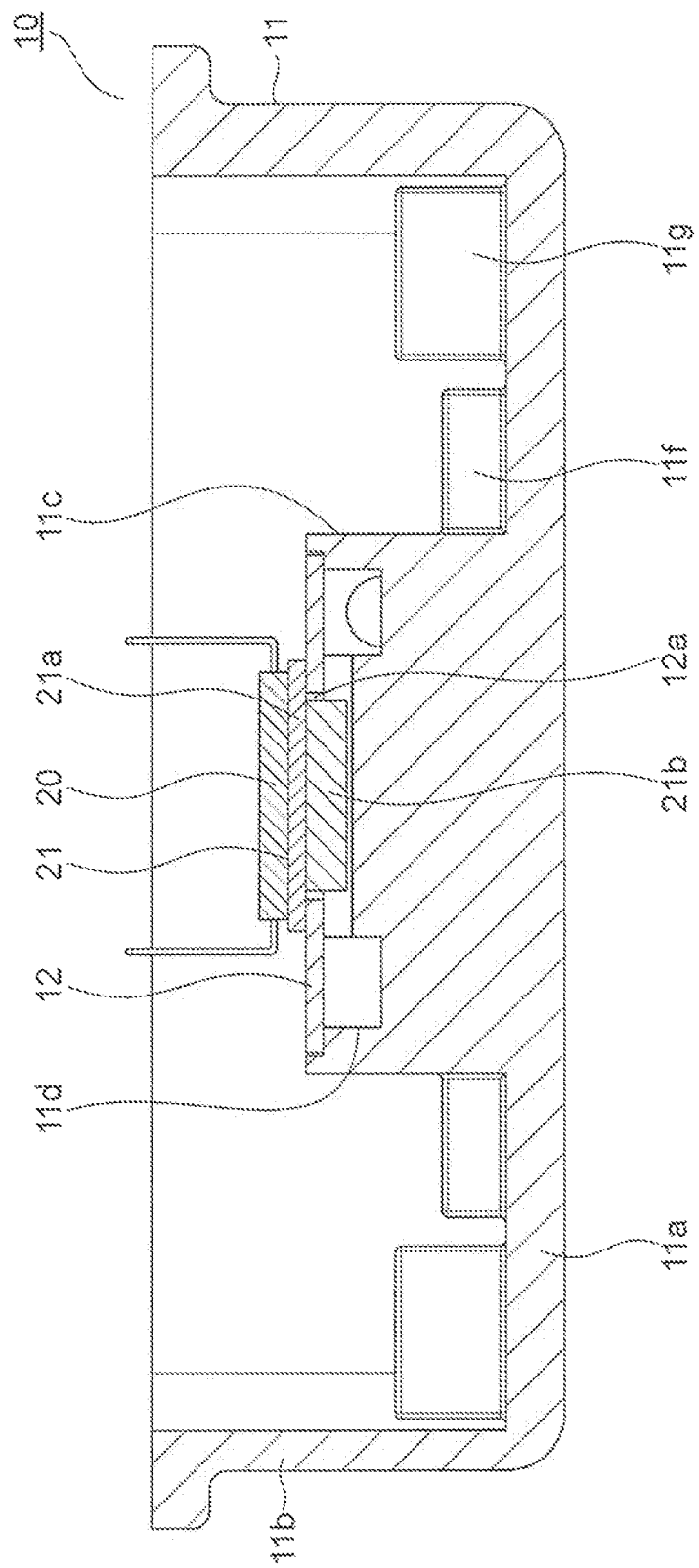
FIG. 10 is a sectional view for illustrating a modification example of the power conversion device according to the first embodiment.

Now, FIG. 10 is a sectional view for illustrating a modification example of the power conversion device 100 according to the first embodiment, and is an illustration of a cross section corresponding to FIG. 5. A cooler upper plate 12 of the modification example has a hole 12a having a rectangular shape in its center.

A heat sink 21 is fixed to each of semiconductor modules 20. The heat sink 21 includes a heat sink base portion 21a and a heat transfer fin 21b. The heat sink base portion 21a is fixed to each of the semiconductor modules 20. Further, the heat sink base portion 21a is superposed on a portion of an upper surface of the cooler upper plate 12, which corresponds to an edge of the hole 12a, and is fixed to the cooler upper plate 12.

A sealing component (not shown) is provided between the cooler upper plate 12 and each of the heat sink base portions 21a. The heat transfer fins 21b pass through the hole 12a and protrude beyond a lower surface of the cooler upper plate 12 toward the bottom portion 11a. The illustration of the heat transfer fin 11e and the first heat transfer members 61 is omitted.

The effects obtained by the power conversion device 100 according to the first embodiment can also be achieved with the above-mentioned configuration.

Second Embodiment

Figure 11:
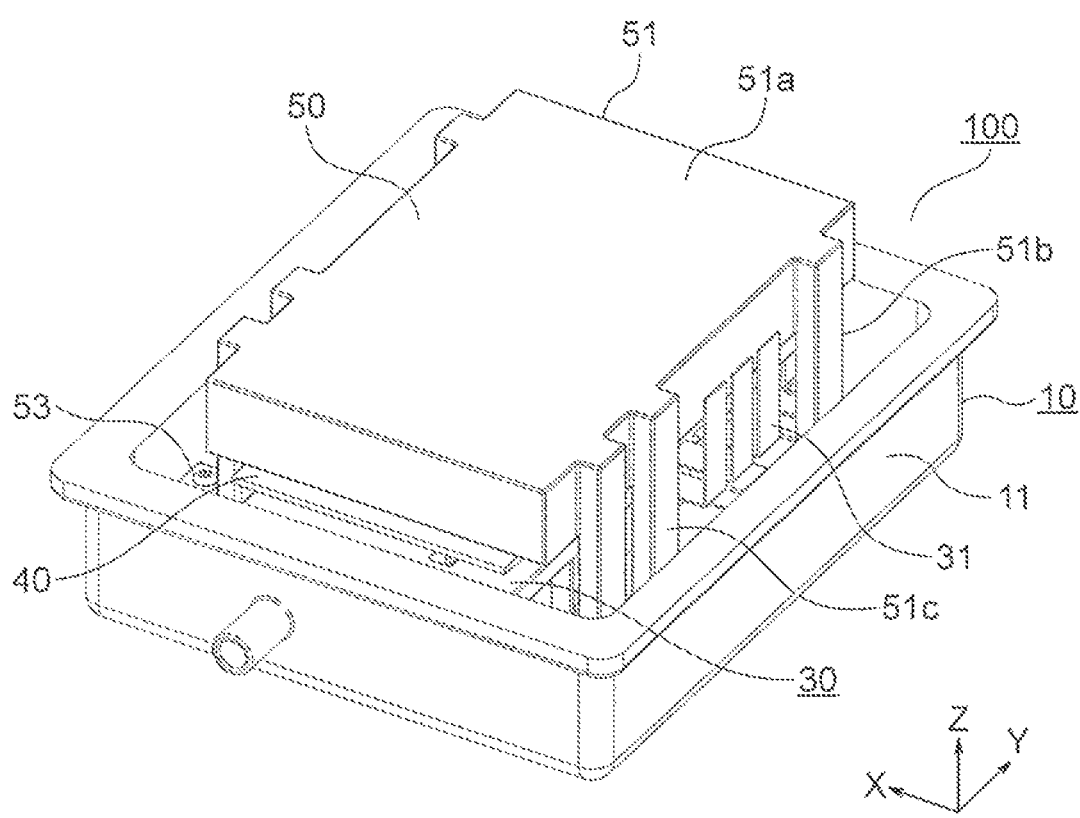
FIG. 11 is a perspective view for illustrating a power conversion device according to a second embodiment.
Figure 12:
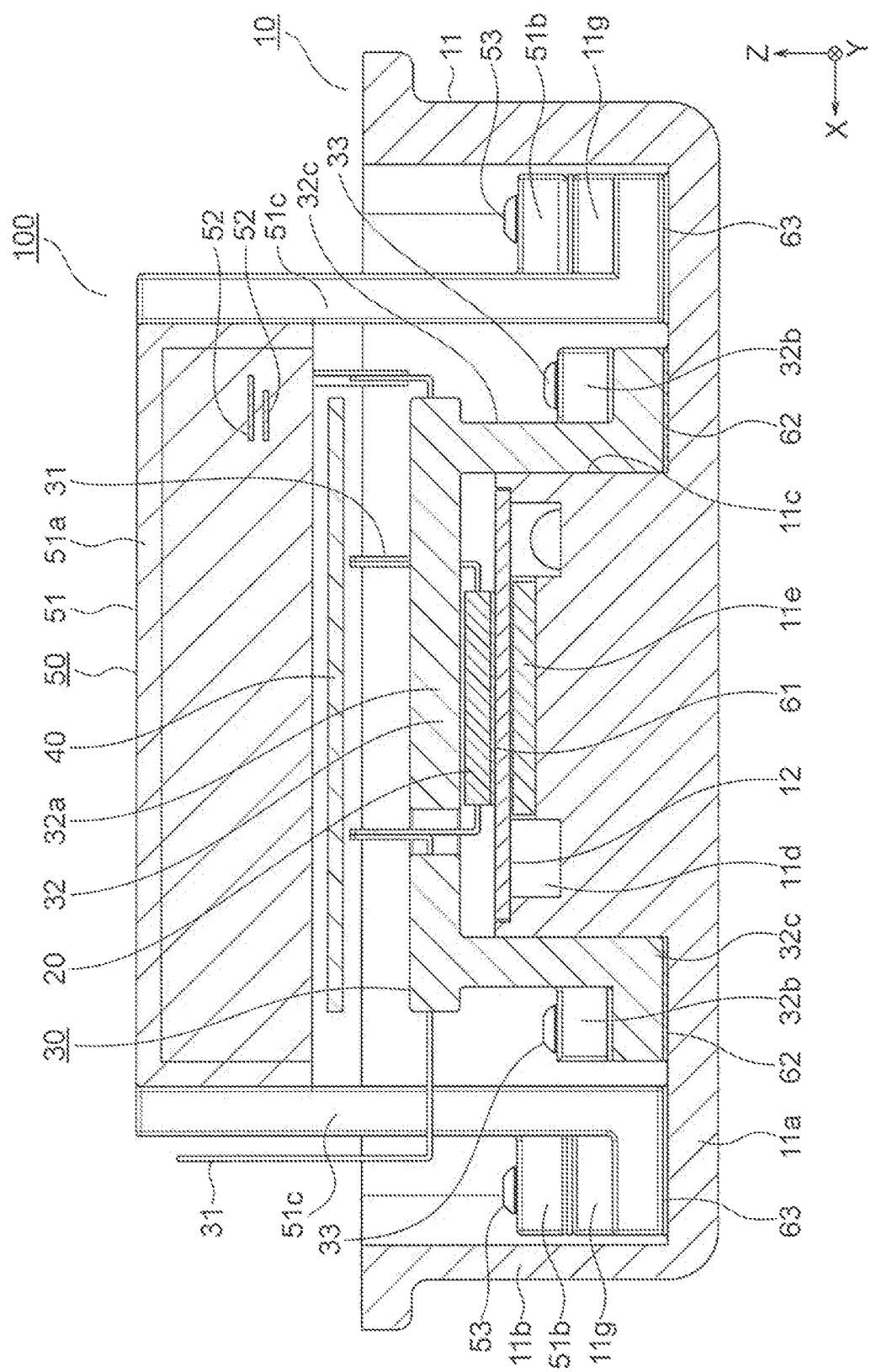
FIG. 12 is a sectional view of the power conversion device of FIG. 11.

Next, FIG. 11 is a perspective view for illustrating a power conversion device 100 according to a second embodiment. FIG. 12 is a sectional view of the power conversion device 100 of FIG. 11, and is an illustration of a cross section taken parallel to an XZ plane of FIG. 11.

A holding member 32 of a bus bar assembly 30 according to the second embodiment further includes a plurality of second bus bar cooling columns 32c each having a bar-like shape.

The plurality of second bus bar cooling columns 32c protrude from a holding member main body 32a toward a bottom portion 11a in parallel to a plurality of first bus bar cooling columns 32b. Further, the plurality of second bus bar cooling columns 32c transfer heat of the bus bar assembly 30 to a cooler 10.

The second bus bar cooling columns 32c are in indirect contact with a bottom portion 11a through intermediation of second heat transfer members 62. Further, the second bus bar cooling columns 32c are in contact with side surfaces of a flow passage defining portion 11c. The plurality of second bus bar cooling columns 32c may be made of a material different from a material of a holding member main body 32a, for example, a metal.

Heat received by the bus bar assembly 30 is transferred through the plurality of first bus bar cooling columns 32b and the plurality of second bus bar cooling columns 32c to the cooler 10, and is released through the cooler 10.

A case 51 of a smoothing capacitor 50 according to the second embodiment further includes a plurality of second capacitor cooling columns 51c, each having a bar-like shape.

The plurality of second capacitor cooling columns 51c protrude from the case main body 51a toward the bottom portion 11a in parallel to a plurality of first capacitor cooling columns 51b. Further, the plurality of second capacitor cooling columns 51c transfer heat of the smoothing capacitor 50 to the cooler 10.

The second capacitor cooling columns 51c are in indirect contact with the bottom portion 11a through intermediation of third heat transfer members 63. The plurality of second capacitor cooling columns 51c may be made of a material different from a material of the case main body 51a, for example, a metal.

Heat generated in the smoothing capacitor 50 is transferred through the plurality of first capacitor cooling columns 51b and the plurality of second capacitor cooling columns 51c to the cooler 10, and is released through the cooler 10.

The other components in the second embodiment are similar or identical to those in the first embodiment.

In the power conversion device 100 as described above, the bus bar assembly 30 includes the plurality of second bus bar cooling columns 32c. Thus, the plurality of second bus bar cooling columns 32c allow the heat received by the bus bar assembly 30 to be more smoothly transferred to the cooler 10 so that the heat is released through the cooler 10. As a result, the cooling performance is improved.

Further, the smoothing capacitor 50 includes the plurality of second capacitor cooling columns 51c. Thus, the plurality of second capacitor cooling columns 51c allow the heat generated in the smoothing capacitor 50 to be more smoothly transferred to the cooler 10 so that the heat is released through the cooler 10. As a result, the cooling performance is improved.

Further, the plurality of second bus bar cooling columns 32c and the plurality of second capacitor cooling columns 51c are in indirect contact with the bottom portion 11a, but are not fixed to the cooler 10 with screws. Thus, the number of positions at which the bus bar assembly 30 and the smoothing capacitor 50 are fixed to the cooler 10 does not increase, and reduction in ease of assembly is prevented.

Third receiving portions may also be provided on the bottom portion 11a. Each of the third receiving portions has a block-like shape, and protrudes in the same direction as a direction in which the flow passage defining portion 11c protrudes. The second bus bar cooling columns 32c may be in contact with the third receiving portions instead of being in indirect contact with the bottom portion 11a.

Further, the second bus bar cooling columns 32c may be in contact with at least one of the first bus bar cooling columns 32b or the side wall portion 11b.

Further, fourth receiving portions may also be provided on the bottom portion 11a. Each of the fourth receiving portions has a block-like shape, and protrudes in the same direction as the direction in which the flow passage defining portion 11c protrudes. The second capacitor cooling columns 51c may be in contact with the fourth receiving portions instead of being in indirect contact with the bottom portion 11a.

Still further, the second capacitor cooling columns 51c may be in contact with at least one of the first capacitor cooling columns 51b or the side wall portion 11b.

Third Embodiment

Figure 13:
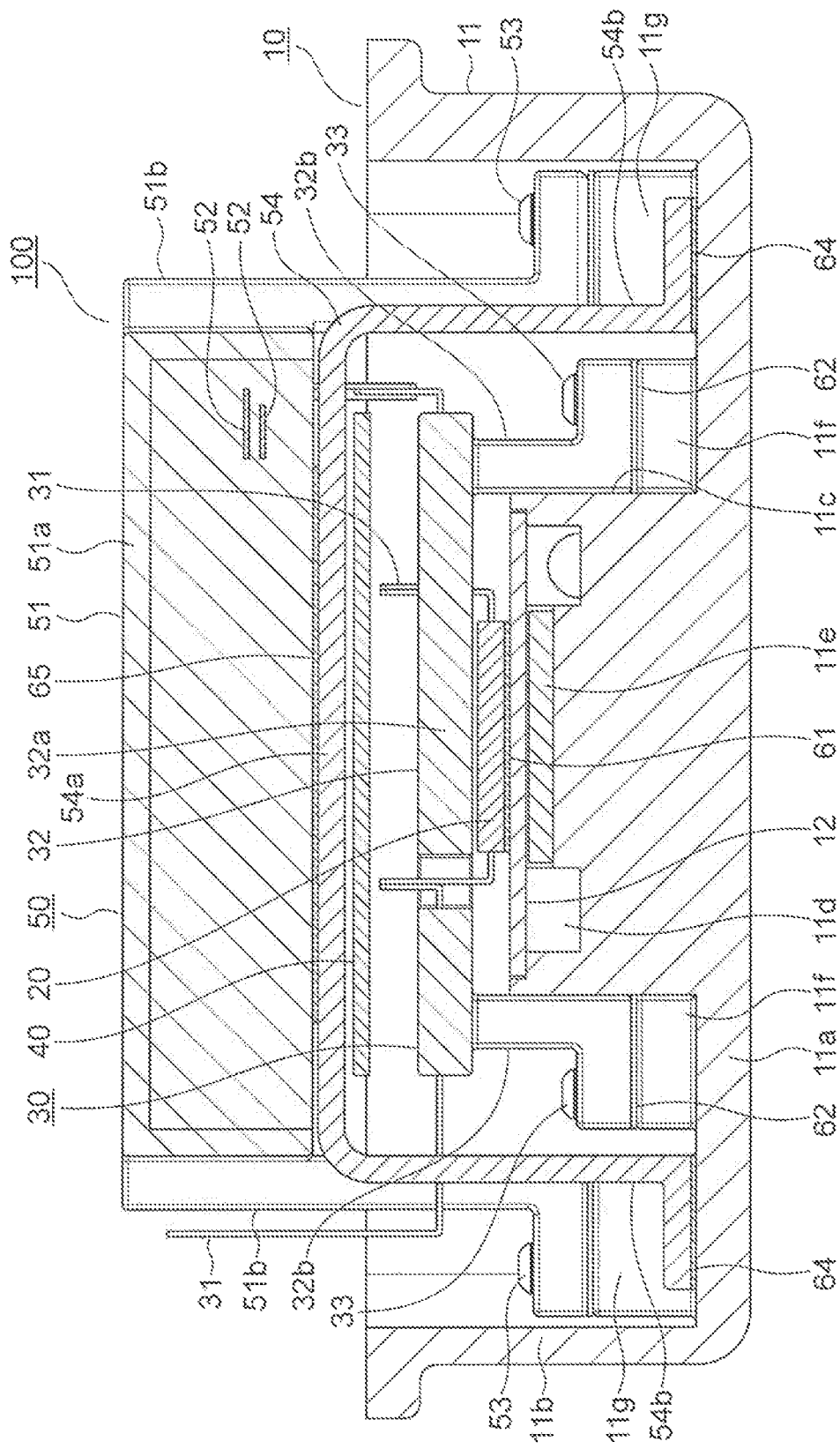
FIG. 13 is a sectional view of a power conversion device according to a third embodiment.

Next, FIG. 13 is a sectional view of a power conversion device 100 according to a third embodiment, and is an illustration of a cross section corresponding to a cross section taken parallel to the XZ plane of FIG. 1.

The power conversion device 100 according to the third embodiment further includes a cooling plate 54 made of a metal. As a material of the cooling plate 54, for example, copper or aluminum is used.

The cooling plate 54 includes a flat plate portion 54a and a pair of leg portions 54b. The flat plate portion 54a is in indirect contact with a surface of a case main body 51a, which is opposed to a control board 40.

The leg portions 54b protrude from the flat plate portion 54a toward a bottom portion 11a, and are in indirect contact with the bottom portion 11a. A fourth heat transfer member 64 serving as a first cooling plate heat transfer member is provided between each of the leg portions 54b and the bottom portion 11a. As a material of the fourth heat transfer members 64, a material having high heat conductivity, for example, grease, solder, adhesive, gap filler, or a compound is used.

A fifth heat transfer member 65 serving as a second cooling plate heat transfer member is provided between the flat plate portion 54a and a case main body 51a. As a material of the fifth heat transfer member 65, a material having high heat conductivity, for example, grease, solder, adhesive, gap filler, or a compound is used.

The cooling plate 54 is connected to a cooler 10 through intermediation of the fourth heat transfer members 64. Further, the cooling plate 54 is connected to a smoothing capacitor 50 through intermediation of the fifth heat transfer member 65. Specifically, a cooling plate connection member in the third embodiment is the smoothing capacitor 50.

Heat generated in the smoothing capacitor 50 is transferred through a plurality of first capacitor cooling columns 51b and the cooling plate 54 to the cooler 10, and is released through the cooler 10.

The other components in the third embodiment are similar or identical to those in the first embodiment.

In the power conversion device 100 as described above, the cooling plate 54 is provided between the smoothing capacitor 50 and the cooler 10. Thus, the cooling plate 54 allows heat generated in the smoothing capacitor 50 to be more smoothly transferred to the cooler 10 so that the heat is released through the cooler 10. As a result, cooling performance is improved.

Further, the fourth heat transfer member 64 is provided at a thermal interface being a plane at which each of the leg portions 54b and the bottom portion 11a are joined together. As a result, an air layer, which is otherwise formed at the thermal interface, is replaced by the fourth heat transfer member 64. Thus, the heat generated in the smoothing capacitor 50 can be more smoothly transferred to the cooler 10. As a result, the cooling performance is improved.

Further, the fifth heat transfer member 65 is provided at a thermal interface being a plane at which the flat plate portion 54a and the case main body 51a are joined together. As a result, an air layer, which is otherwise formed at the thermal interface, is replaced by the fifth heat transfer member 65. Thus, the heat generated in the smoothing capacitor 50 can be more smoothly transferred to the cooler 10. As a result, the cooling performance is improved.

Further, the cooling plate 54 is made of a metal. Thus, heat generated in the smoothing capacitor 50 can be more smoothly transferred to the cooler 10. As a result, the cooling performance is improved.

Fifth receiving portions may also be provided on the bottom portion 11a. Each of the fifth receiving portions protrudes in the same direction as a direction in which a flow passage defining portion 11c protrudes. The cooling plate 54 may be in contact with the fifth receiving portions instead of being in indirect contact with the bottom portion 11a. Still further, the cooling plate 54 may be fastened to the fifth receiving portion with fasteners.

Further, the cooling plate 54 may be in contact with at least one of the first capacitor cooling columns 51b or the side wall portion 11b.

Still further, the power conversion device 100 according to the third embodiment may include the second capacitor cooling columns 51c which have been described in the second embodiment. In this case, the cooling plate 54 may be in contact with the second capacitor cooling columns 51c.

Still further, when a control board 40 is not arranged between the smoothing capacitor 50 and a bus bar assembly 30, the flat plate portion 54a may be sandwiched between the smoothing capacitor 50 and the bus bar assembly 30. Specifically, a cooling plate connection member may be both of the smoothing capacitor 50 and the bus bar assembly 30.

Fourth Embodiment

Figure 14:
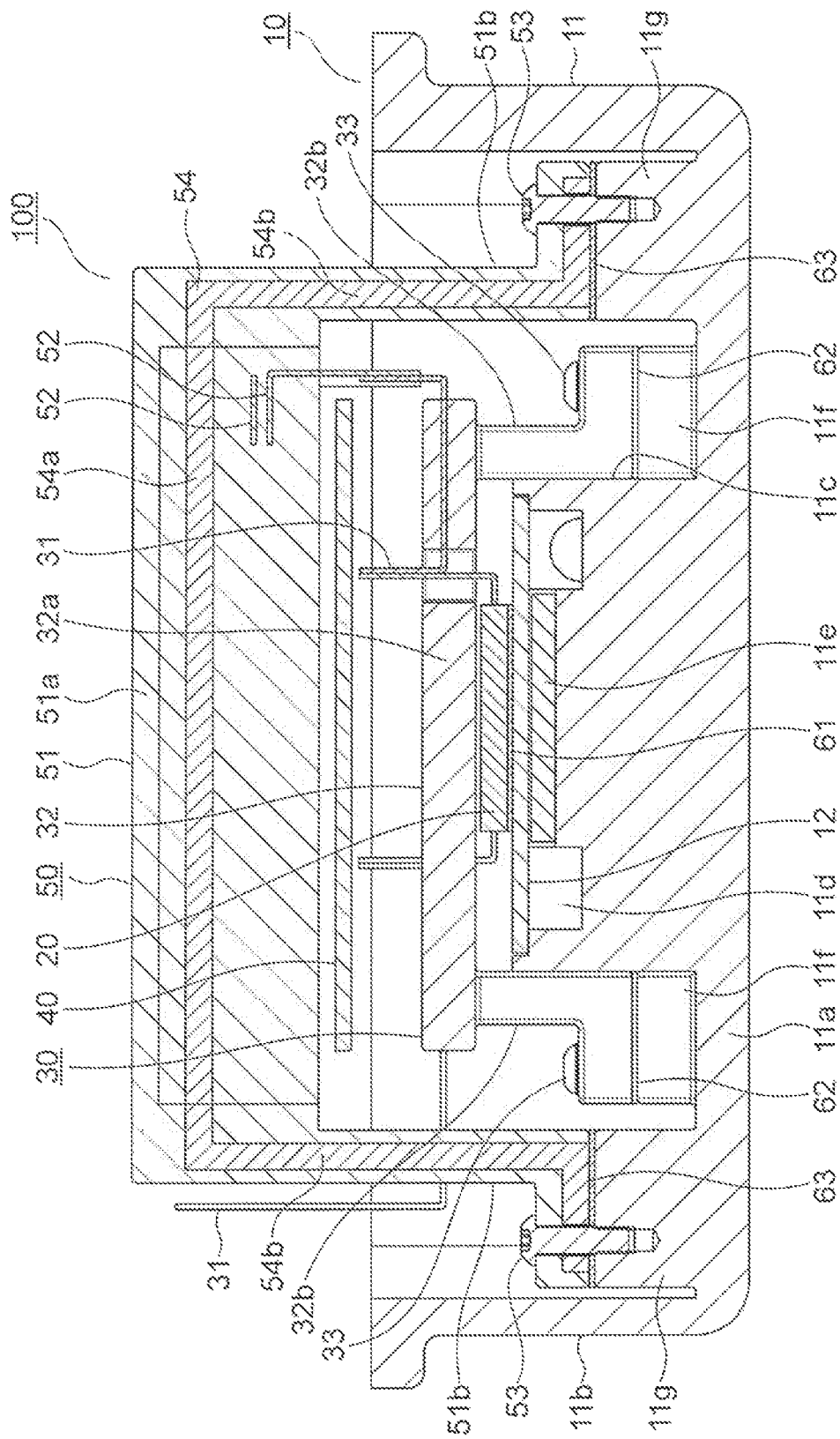
FIG. 14 is a sectional view of a power conversion device according to a fourth embodiment.

Next, FIG. 14 is a sectional view of a power conversion device 100 according to a fourth embodiment, and is an illustration of a cross section corresponding to a cross section taken parallel to the XZ plane of FIG. 1.

In the fourth embodiment, at least a part of a cooling plate 54 is embedded in a case 51. In the example of FIG. 14, the entirety of the cooling plate 54 is embedded in the case 51. Further, the cooling plate 54 is arranged inside the case 51 at a distance from a plurality of capacitor bus bars 52. Further, an epoxy resin is supplied to the case 51 to thereby integrate the cooling plate 54 with the case 51.

The other components in the fourth embodiment are similar or identical to those in the third embodiment.

In the power conversion device 100 as described above, the cooling plate 54 is embedded in the case 51. Thus, heat generated in the smoothing capacitor 50 can be more smoothly transferred to the cooler 10. As a result, cooling performance is improved.

In the fourth embodiment, only a part of the cooling plate 54 may be embedded in the case 51.

In the third and fourth embodiments, a cooling plate made of a metal, which is independent of the cooling plate 54, may be provided between a bus bar assembly 30 serving as a cooling plate connection member and the cooler 10.

Further, in the first to fourth embodiments, the number of bus bar cooling columns and the number of capacitor cooling columns are not limited to particular numbers.

Still further, in the first to fourth embodiments, the cooler 10 may include the bus bar cooling columns as a part of the cooler 10. In this case, the bus bar cooling columns protrude from the bottom portion 11a toward the bus bar assembly 30 to be in contact with the bus bar assembly 30 directly or through intermediation of heat transfer members.

Still further, both of the cooler 10 and the bus bar assembly 30 may be provided with the bus bar cooling columns.

Still further, in the first to fourth embodiments, the cooler 10 may include the capacitor cooling columns as a part of the cooler 10. In this case, the capacitor cooling columns protrude from the bottom portion 11a toward the smoothing capacitor 50 to be in contact with the smoothing capacitor 50 directly or through intermediation of heat transfer members.

Still further, both of the cooler 10 and the smoothing capacitor 50 may be provided with the capacitor cooling columns.

Still further, the cooling column-equipped member may be the smoothing capacitor 50 alone. Specifically, the bus bar cooling columns may be omitted.

Still further, the cooling column-equipped member may be the bus bar assembly 30 alone. Specifically, the capacitor cooling columns may be omitted.

Still further, as a material of the cooling columns, for example, aluminum may be used.

Still further, the refrigerant is not limited to water, and may be a fluid other than water.

Still further, the bus bar assembly 30 is only required to electrically connect at least two of the semiconductor modules 20, the smoothing capacitor 50, and the power supply.

What is claimed is:

1. A power conversion device, comprising:
   a semiconductor module;
   a smoothing capacitor configured to smooth an input voltage to the semiconductor module;
   a bus bar assembly configured to electrically connect at least two of the semiconductor module, the smoothing capacitor, and a power supply; and
   a cooler; and
   a cooling plate, which is connected to a cooling plate connection member being at least one of the smoothing capacitor and the bus bar assembly, and is connected to the cooler,
   wherein the semiconductor module, the bus bar assembly, and the smoothing capacitor are superposed on the cooler in the stated order from the cooler side,
   wherein at least one of a cooling column-equipped member, which is at least one of the smoothing capacitor and the bus bar assembly, and the cooler is provided with a cooling column configured to transfer heat of the cooling column-equipped member to the cooler, and wherein at least a part of the cooling plate is embedded in the cooling plate connection member.

2. The power conversion device according to claim 1, further comprising a module heat transfer member provided between the semiconductor module and the cooler.

3. The power conversion device according to claim 1,
wherein the cooling column is provided at the cooling column-equipped member, and
wherein a cooling column heat transfer member is provided between the cooling column and the cooler.

4. The power conversion device according to claim 1,
wherein the cooler includes a cooler main body,
wherein the cooler main body includes:
- a bottom portion having a flat plate-like shape;
- a flow passage defining portion, which protrudes from the bottom portion, and has a refrigerant flow passage;
- a first receiving portion protruding from the bottom portion in the same direction as a direction in which the flow passage defining portion protrudes; and
- a second receiving portion, which protrudes from the bottom portion in the same direction as the direction in which the flow passage defining portion protrudes, and is arranged farther from the flow passage defining portion than the first receiving portion is, wherein each of the bus bar assembly and the smoothing capacitor is the cooling column-equipped member,
wherein the bus bar assembly is provided with a bus bar cooling column as the cooling column,
wherein the smoothing capacitor is provided with a capacitor cooling column as the cooling column,
wherein the bus bar cooling column is connected to the first receiving portion, and
wherein the capacitor cooling column is connected to the second receiving portion.

5. The power conversion device according to claim 1, further comprising a first cooling plate heat transfer member provided between the cooling plate and the cooler.

6. The power conversion device according to claim 1, further comprising a second cooling plate heat transfer member provided between the cooling plate and the cooling plate connection member.

7. The power conversion device according to claim 1, wherein the cooling plate is made of a metal.

* * * * *